(12) United States Patent
Lin

(10) Patent No.: US 7,384,283 B2
(45) Date of Patent: Jun. 10, 2008

(54) FIXING MEMBER FOR FIXING A CIRCUIT BOARD TO A HOUSING OF AN ELECTRONIC DEVICE

(75) Inventor: Linger Lin, Taipei (TW)

(73) Assignee: Inventec Corporation (TW)

( * ) Notice: Subject to any disclaimer, the term of this patent is extended or adjusted under 35 U.S.C. 154(b) by 0 days.

(21) Appl. No.: 11/518,016

(22) Filed: Sep. 8, 2006

(65) Prior Publication Data
US 2008/0064241 A1    Mar. 13, 2008

(51) Int. Cl.
*H01R 13/68* (2006.01)
(52) U.S. Cl. ..................................... 439/157
(58) Field of Classification Search ............... 439/157, 439/160, 76.1, 567, 551, 564, 328, 325; 361/754, 361/752, 758, 825; 248/1, 560; 29/450
See application file for complete search history.

(56) References Cited
U.S. PATENT DOCUMENTS 3,956,803 A * 5/1976 Leitner ..................... 411/349
4,372,015 A * 2/1983 Rhoton ......................... 269/47
4,789,287 A * 12/1988 Le ............................... 411/107
6,543,098 B2 * 4/2003 Meyer et al. ................. 24/289
6,695,629 B1 * 2/2004 Mayer ......................... 439/92
6,799,980 B2 * 10/2004 Bloomfield et al. .......... 439/92
6,997,658 B2 * 2/2006 Fly ............................. 411/107

* cited by examiner

*Primary Examiner*—Alexander Gilman
(74) *Attorney, Agent, or Firm*—Peter F. Corless; Steven M. Jensen; Edwards Angell Palmer & Dodge LLP

(57) ABSTRACT

A fixing member for fixing a circuit board to a housing of an electronic device is disclosed. A positioning unit is installed between the circuit board and the housing for positioning the circuit board at a predetermined location relative to the housing. The fixing member is used for fixing the circuit board when the circuit board reaches the predetermined location. The fixing member includes a body and an abutting portion disposed on the body. The body has a first end pivotally mounted on the housing and a free second end capable of being pivotally rotated. The abutting portion is disposed at the free second end of the body. The abutting portion can abut against the circuit board so as to fix the circuit board when the circuit board reaches the predetermined location and the free second end reaches on the circuit board by pivotal rotation.

13 Claims, 6 Drawing Sheets

FIXING MEMBER FOR FIXING A CIRCUIT BOARD TO A HOUSING OF AN ELECTRONIC DEVICE

BACKGROUND OF THE INVENTION

1. Field of the Invention

The present invention relates generally to fixing members, and more particularly to a fixing member for fixing a circuit board to a housing of an electronic device.

2. Description of Related Art

Generally, a server has a large amount of modular circuit boards disposed therein.

As shown in FIG. 1, an LED circuit board 10 is disposed in a server 1. The LED circuit board 10 is electrically connected to the inner side of the server 1 and meanwhile the circuit board 10 has a light panel 101 disposed at the front side thereof and exposed from the server 1 such that the component status of the server can be displayed through the light panel 101 to users for inspection.

The LED circuit board 10 is screw fixed to the server 1. Therefore, when the LED circuit board 10 needs to be removed from the server, the screws should be removed first, thereby complicating the removal process.

Referring to FIG. 2, a transferring back plate 20 is disposed inside a server 2. The transferring back plate 20 has a plurality of electric slots (not shown) for hot plug of storage devices such as a hard disk enclosure (not shown) such that the storage information of the storage devices can be transferred to the motherboard. The transferring back plate 20 is also screw fixed to the server 2.

Since the motherboard often needs to be changed or hard disk enclosures having different specification need to be inserted, modular circuit boards such as a LED circuit board and a transferring back plate need to be changed accordingly. However, the screw fixing method brings inconvenience and complicates the install and removal processes. In addition, tools are necessary in such a screw fixing method.

SUMMARY OF THE INVENTION

Accordingly, an objective of the present invention is to provide a fixing member for fixing a circuit board, through which the circuit board can easily and quickly be installed to and removed from a housing of an electronic device.

Another objective of the present invention is to provide a fixing member for fixing a circuit board without the need of any tools.

In order to attain the above and other objectives, the present invention proposes a fixing member for fixing a circuit board to a housing of an electronic device, a positioning unit being disposed between the circuit board and the housing for positioning the circuit board at a predetermined location relative to the housing and the fixing member being used to fix the circuit board when the circuit board reaches the predetermined location. The fixing member comprises: a body having a first end pivotally mounted to the housing and a free second end capable of being pivotally rotated; and an abutting portion disposed at the free second end, which can abut against the circuit board so as to fix the circuit board when the circuit board reaches the predetermined location and the free second end reaches on the circuit board by pivotal rotation.

The electronic device is a server and the circuit board is an LED circuit board or a transferring back plate. To fix an LED circuit board by the fixing member of the present invention, the LED circuit board is horizontally disposed and the abutting portion of the fixing member horizontally abuts against the LED circuit board. To fix a transferring back plate by the fixing member of the present invention, the transferring back plate is vertically disposed and the abutting portion of the fixing member vertically presses against the transferring back plate.

Compared with the complicated screw fixing method of the prior art, the fixing member of the present invention allows easy and quick install and removal of a circuit board such as an LED circuit board and a transferring back plate.

In a preferred embodiment, the positioning unit comprises a male positioning member disposed on the circuit board and a female positioning portion disposed on the housing of the electronic device, the female positioning portion having an inserting end and a positioning end connected to the inserting end. To mount the circuit board to the housing of the electronic device, the male positioning member is inserted to the inserting end of the female positioning portion and further moved to the positioning end. Then, the body is rotated such that the abutting portion of the fixing member can abut against the circuit board, thereby fixing the circuit board to the housing of the electronic device.

Alternatively, the male positioning member is disposed on the circuit board and the female positioning portion is disposed on the housing of the electronic device.

Compared with the prior art that needs tools for install or removal of an LED circuit board and a transferring back plate, the fixing member of the present invention can easily fix the circuit board by rotation in combination with a positioning unit between the circuit board and the electronic device, thereby eliminating the need of any tools.

Moreover, the body of the fixing member can be a resilient body so as to make the abutting portion of the fixing member closely abut against the circuit board. An operating protruding sheet can be disposed on the body so as to facilitate the operation of a user.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification. The present invention can also be performed or applied by other different embodiments. The details of the specification may be on the basis of different points and applications, and numerous modifications and variations can be made without departing from the spirit of the present invention.

First Embodiment

Figure 1:
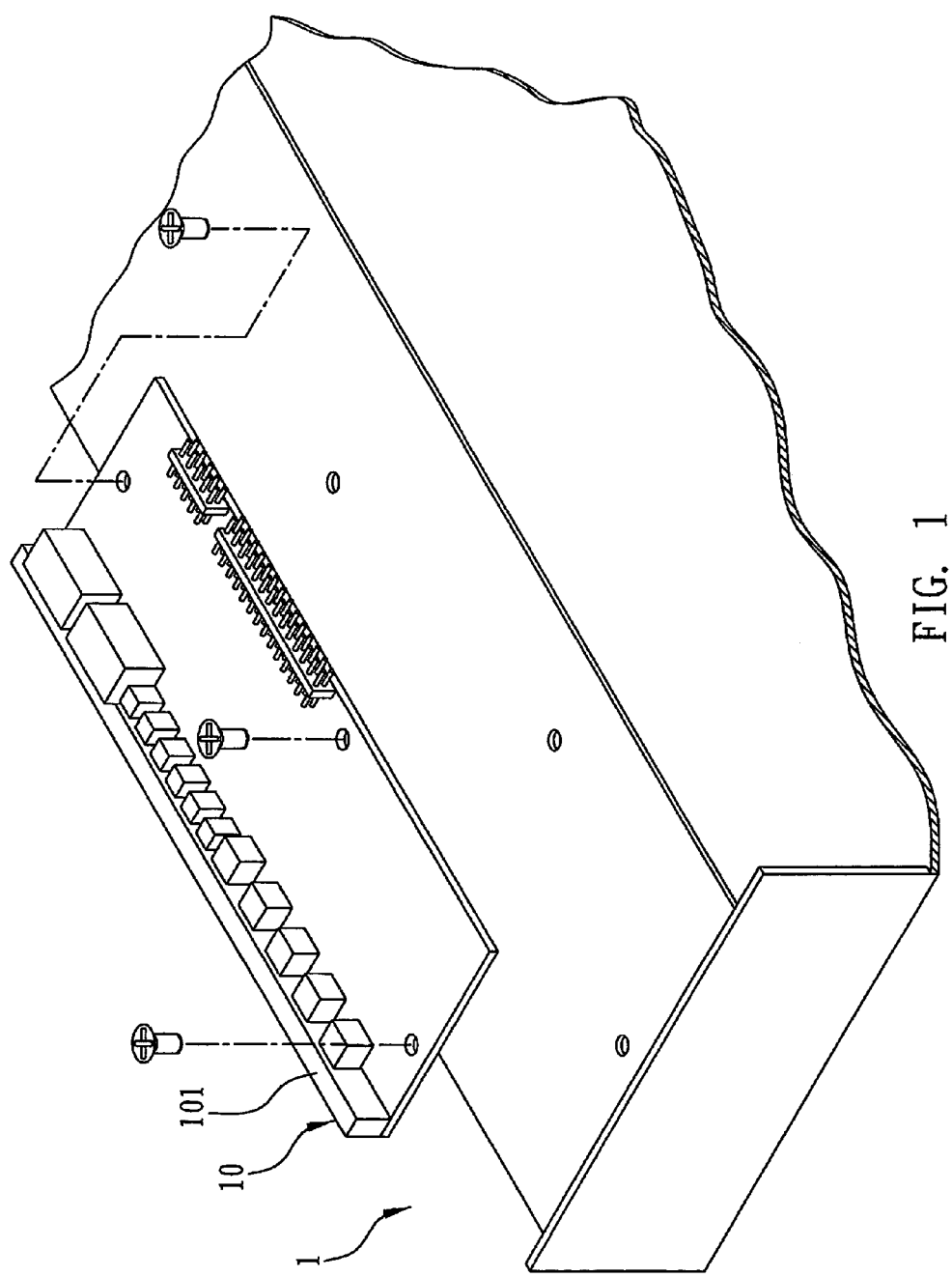
FIG. 1 shows a conventional fixing structure of an LED circuit board.
Figure 2:
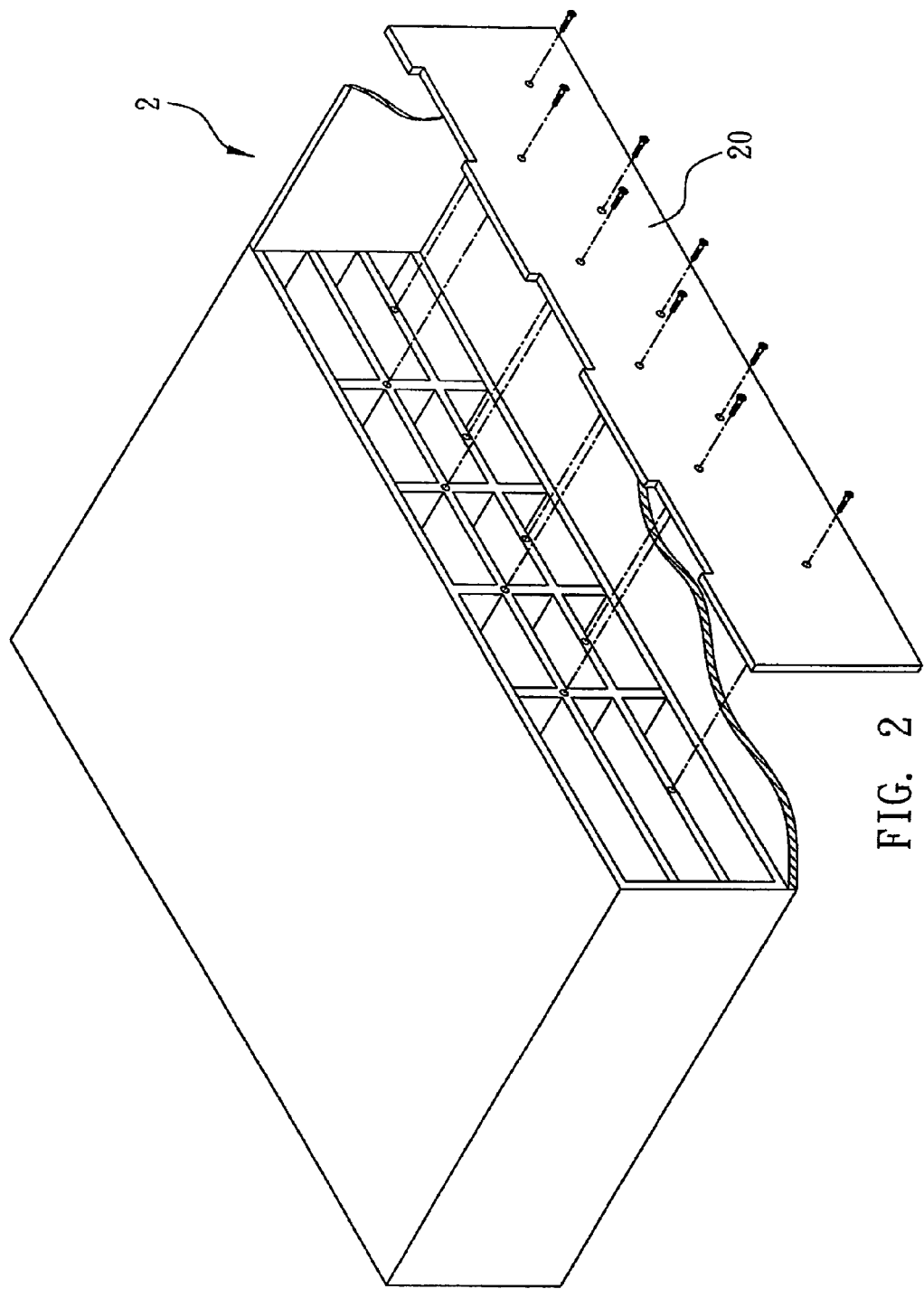
FIG. 2 shows a conventional fixing structure of a transferring back plate.
Figure 3A:
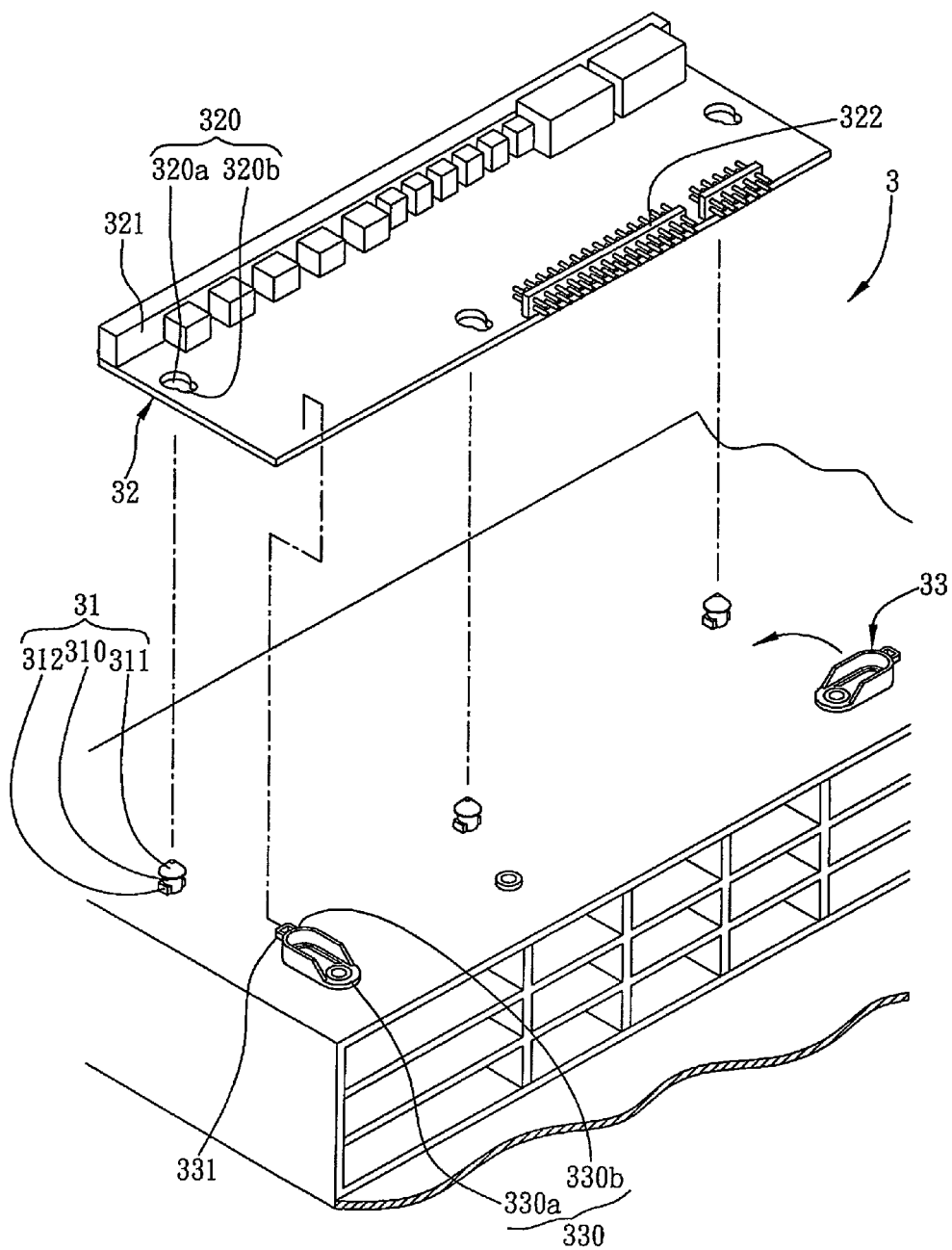
FIGS. 3A and 3B show a fixing member for fixing a circuit board according to a first embodiment of the present invention.

Referring to FIG. 3A, a fixing member 33 of the present invention is provided for fixing a circuit board 32 to a housing of an electronic device 3. A positioning unit is provided between the circuit board 32 and the housing for positioning the circuit board 32 at a predetermined location, while the fixing member 33 is used for fixing the circuit board 32 when the circuit board 32 reaches the predetermined location. Therein, the electronic device 3 is a server and the circuit board 32 is an LED circuit board. A light panel 321 is disposed at one side of the circuit board 32 and exposed from the electronic device 3 (server), and an electric connecting portion 322 is disposed at the other side of the circuit board 32. The electric connecting portion 322 can be electrically connected to the inner side of the electronic device 3 through signal lines (not shown).

The fixing member 33 of the present invention comprises: a body 330 having a first end 330a pivotally mounted to the housing and a free second end 330b capable of being pivotally rotated; and an abutting portion 331 disposed at the free second end 330b, for abutting against the circuit board 32 so as to fix the circuit board 32 when the circuit board 32 reaches the predetermined location and the free second end 330b reaches on the circuit board 32 by pivotal rotation. The body 330 can be a resilient body allowing the abutting portion 331 to closely abut against the circuit board 32.

Compared with the complicated screw fixing method of the prior art, the fixing member 33 of the present invention allows the circuit board to be mounted to and removed from the housing easily and quickly.

The positioning unit comprises a male positioning member 31 disposed on the housing of the electronic device 3 and a female positioning portion 320 disposed on the circuit board 32. The female positioning portion 320 is composed of an inserting end 320a and a positioning end 320b connecting with the inserting end 320a. The male positioning member 31 has a short column 310, and an umbrella head portion 311 formed on the top of the short column 310 and having a bigger external diameter than the short column 310. The inserting end 320a of the female positioning portion 320 is a big opening allowing the umbrella head portion 311 to be inserted thereto, and the positioning end 320b is a small opening capable of holding the short column 310. Furthermore, at the bottom of the short column 310 there is disposed a base 312, the external diameter of which is bigger than that of the inserting end 320a and the positioning end 320b of the female positioning portion 320 so as to support the bottom surface of the circuit board 32.

However, the positioning of the circuit board 32 to the electronic device 3 is not limited to the above. Alternatively, the male positioning member can be disposed on the circuit board 32, and correspondingly, the female positioning portion can be disposed on the housing of the electronic device.

In addition, the number of fixing members 33 can range from one to a plurality. In the present embodiment, two fixing members 33 respectively abut against two ends of the circuit board 32 at a same side for averaging the force exerted on the circuit board 32 and preventing interfering the electric connection between the electric connecting portion 322 and the electronic device 3.

Figure 3B:
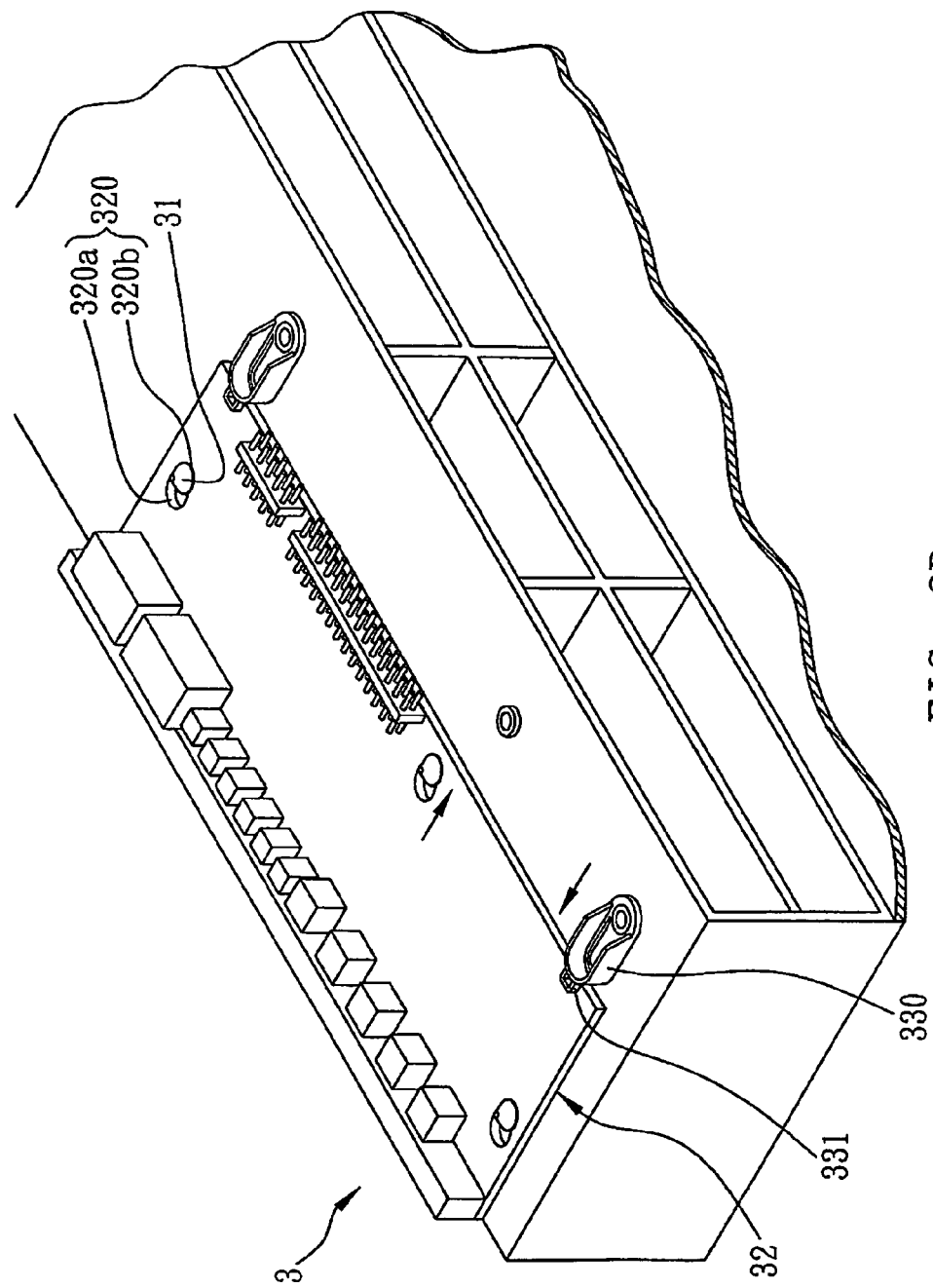

Referring to FIG. 3B, to mount the circuit board 32 to the housing of the electronic device 3, the male positioning member 31 is inserted to the inserting end 320a of the female positioning portion 320 and further moved to the positioning end 320b. Then, the abutting portion 331 of the fixing member 33 is made to abut against the circuit board 32, thereby fixing the circuit board 32 to the housing of the electronic device 3.

Similarly, to remove the circuit board 32 from the housing of the electronic device 3, the fixing member 33 is rotated to make the abutting portion 331 leave the circuit board 32. Thereafter, the circuit board 32 is moved such that the female positioning portion 320 can be removed from the male positioning member 31 through the inserting end 320a thereof, thereby removing the circuit board 32 from the housing of the electronic device 3.

Compared with the prior art that needs tools for install or removal of the LED circuit board, the fixing member of the present invention can easily fix the circuit board by rotation in combination with a positioning unit between the circuit board and the electronic device, thereby eliminating the need of any tools.

Figure 3C:
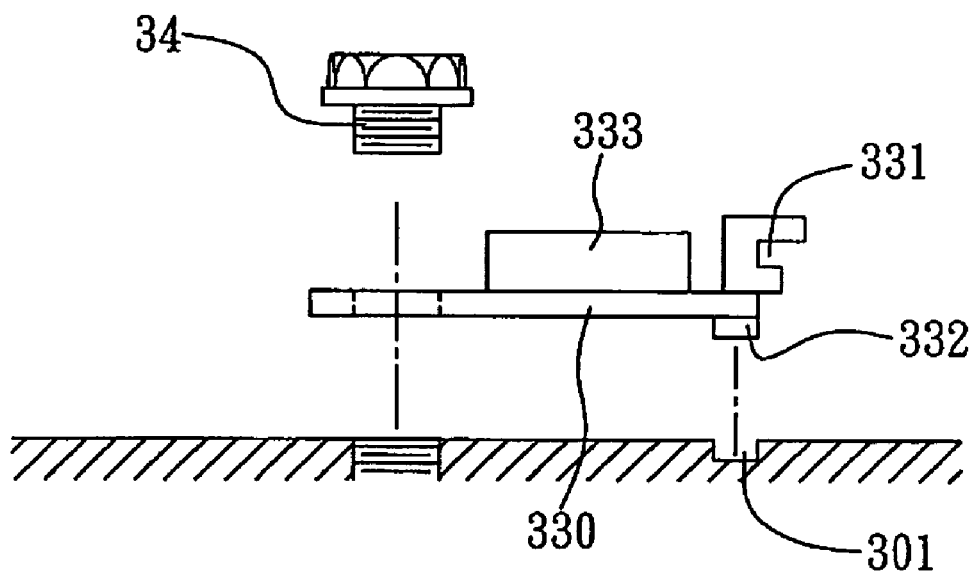
FIGS. 3C and 3D respectively show a side sectional view of the fixing member according to a first embodiment of the present invention.
Figure 3D:
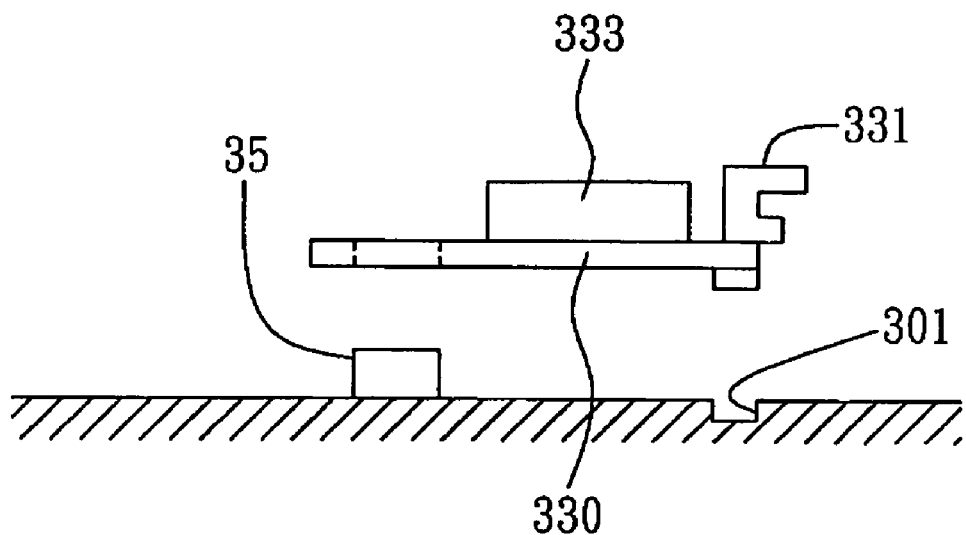

Referring to FIGS. 3C and 3D, the first end 330a and the second end 330b of the body 330 are disposed opposed to each other. Thus, when the body 330 reaches a location perpendicular to one side of the circuit board 32 by rotation, the abutting portion 331 reaches the abutting location. A positioning protruding portion 332 can further be disposed on the body 330 at a side facing the housing of the electronic device 3, and a positioning recess portion 30 corresponding to the positioning protruding portion 332 can be disposed on the housing so as to fix the rotating angle of the body 330. Furthermore, the abutting portion 331 can be composed of two sheets with a certain interval therebetween corresponding to the circuit board 33 so as to hold the circuit board 33 for strengthening the fixing stability.

The first end 330a has a circular through hole. As shown in FIG. 3C, by combining the circular through hole with a screw bolt 34, the body 330 can be pivotally mounted to the housing of the electronic device 3. Or as shown in FIG. 3D, the electronic device 3 has a cylinder that can be closely engaged with the circular through hole, thereby pivotally mounting the body 330 to the housing of the electronic device 3.

In addition, the body 330 further comprises an operating protruding sheet 333 disposed away from the housing. A user can operate the operating protruding sheet 333 so as to rotate the body 330. The operating protruding sheet 333 can be disposed on opposed sides of the body 330. Alternatively, the operating protruding sheet 333 can be disposed at the central position of the body 330.

Second Embodiment

Figure 4:
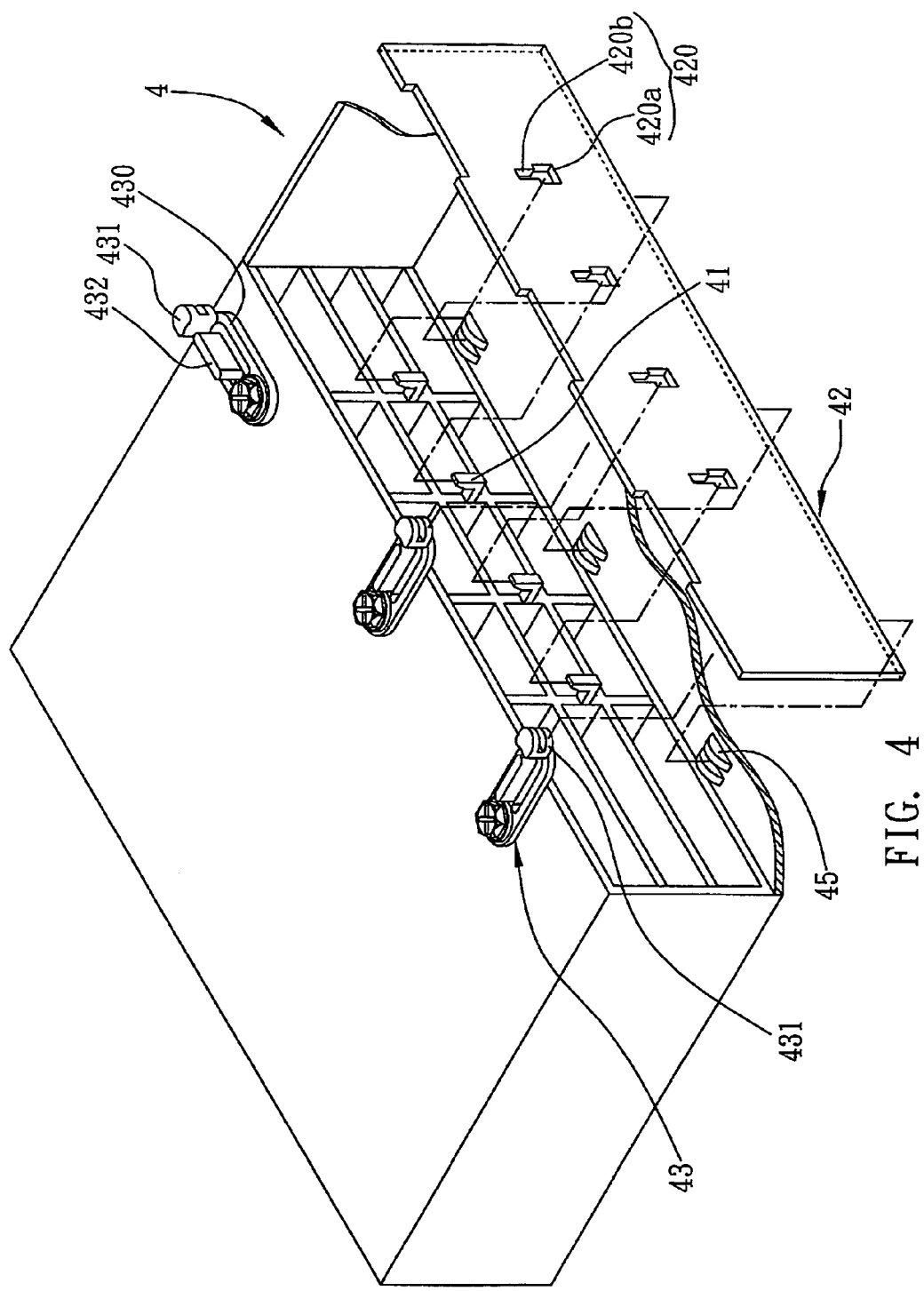
FIG. 4 shows a fixing member for fixing a circuit board according to a second embodiment of the present invention.

Referring to FIG. 4, the fixing member 43 is used to fix a transferring back plate 42 to the housing of an electronic device 4. The transferring back plate 42 is disposed inside the electronic device 4 for hot plug of storage devices (not shown).

In the present embodiment, since the storage devices are horizontally plugged onto the transferring back plate 42, the transferring back plate 42 needs to be vertically disposed. Thus, the abutting portion 431 of the fixing member 43 needs to be vertically pressed against the circuit board 42. A positioning slot 45 is formed on the housing of the electronic device 4 so as to position one side of the circuit board and prevent the circuit board 42 from being oblique.

Preferably, the male positioning member 41 disposed on the housing of the electronic device 41 is a hook. And the inserting end 420a of the female positioning portion 420 is a wide slit, to which the hook can be inserted. The positioning end 420b of the female positioning portion 420 is a narrow slit capable of holding the hook. The hook is inserted to the wide slit first and then by down-pressing the circuit board 42, the hook is engaged with the narrow slit.

In the present embodiment, there is a plurality of the fixing members 43. Therefore, the operating protruding sheet 432 can be disposed at the central position of the body 430 so as to facilitate operation of a user.

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A fixing member for fixing a circuit board to a housing of an electronic device, the fixing member being used to fix the circuit board when the circuit board is positioned at a predetermined location and parallel to from the housing, the fixing member comprising:
   a body having a first end pivotally mounted to the housing and a second end capable of being pivotally rotated, the first end and the second end being located on an identical axis plane; and
   an abutting portion disposed at the second end, for abutting against the circuit board so as to fix the circuit board when the circuit board reaches the predetermined location and the second end rotates from a first position where the the identical axis is parallel to the circuit board to a second position different from the first position and reaches on the circuit board by pivotal rotation.

2. The fixing member of claim 1, wherein the circuit board is horizontally disposed and the abutting portion horizontally abuts against the circuit board.

3. The fixing member of claim 1, further comprising a positioning protruding portion disposed at one side of the body facing the housing of the electronic device, and a positioning recess portion disposed on the housing of the electronic device corresponding to the positioning protruding portion for positioning the rotating angle of the body.

4. The fixing member of claim 1, wherein the body is a resilient body.

5. The fixing member of claim 1, further comprising an operating protruding sheet disposed at either two sides or center of the body and disposed away from the housing.

6. The fixing member of claim 1, wherein the abutting portion abuts against the circuit board to limit a degree of freedom of the circuit board in a predetermined direction.

7. The fixing member of claim 1, wherein the circuit board is positioned at the predetermined location from the housing by a positioning unit disposed between the circuit board and the housing, and the positioning unit comprises a male positioning member disposed on the housing of the electronic device and a female positioning portion disposed on the circuit board, the female positioning portion having an inserting end and a positioning end connected to the inserting end, by inserting the male positioning member to the inserting end of the female positioning portion and moving the male positioning member to the positioning end of the female positioning portion, the circuit board is positioned at the predetermined location relative to the housing.

8. The fixing member of claim 7, wherein the male positioning member has a short column, an umbrella head portion formed on the top of the short column and a base disposed at the bottom of the short column, the external diameter of the umbrella head portion being bigger than that of the short column and the external diameter of the base being bigger than that of the inserting end and the positioning end of the female positioning portion, the inserting end of the female positioning portion being a big opening to which the umbrella head portion can be inserted and the positioning end being a small opening capable of holding the short column.

9. The fixing member of claim 7, wherein the male positioning member is a hook, the inserting end of the female positioning portion is a wide slit to which the hook can be inserted, and the positioning end of the female positioning member is a narrow slit capable of holding the hook, the hook can be passed through the wide slit and engaged with the narrow slit.

10. The fixing member of claim 1, wherein the positioning unit comprises a male positioning member disposed on the circuit board and a female positioning portion disposed on the housing of the electronic device, the female positioning portion having an inserting end and a positioning end connected to the inserting end, by inserting the male positioning member to the inserting end of the female positioning portion and moving the male positioning member to the positioning end of the female positioning portion, the circuit board is positioned at the predetermined location relative to the housing.

11. The fixing member of claim 7, wherein the male positioning member has a short column, an umbrella head portion formed on the top of the short column and a base disposed at the bottom of the short column, the external diameter of the umbrella head portion being bigger than that of the short column and the external diameter of the base being bigger than that of the inserting end and the positioning end of the female positioning portion, the inserting end of the female positioning portion being a big opening to which the umbrella head portion can be inserted and the positioning end being a small opening capable of holding the short column.

12. The fixing member of claim 11, wherein the circuit board is horizontally disposed and the abutting portion horizontally abuts against the circuit board.

13. The fixing member of claim 10, wherein the male positioning member is a hook, the inserting end of the female positioning portion is a wide slit to which the hook can be inserted, and the positioning end of the female positioning member is a narrow slit capable of holding the hook, the hook can be passed through the wide slit and engaged with the narrow slit.

* * * * *